United States Patent
Blattner et al.

(10) Patent No.: US 7,981,306 B2
(45) Date of Patent: Jul. 19, 2011

(54) SUPPLYING RF POWER TO A PLASMA PROCESS

(75) Inventors: Manfred Blattner, Emmendingen (DE); Markus Winterhalter, Bad Krozingen (DE); Ekkehard Mann, Gundelfingen (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 1195 days.

(21) Appl. No.: 11/464,000

(22) Filed: Aug. 11, 2006

(65) Prior Publication Data

US 2007/0044715 A1 Mar. 1, 2007

(30) Foreign Application Priority Data

Aug. 13, 2005 (EP) .................................. 05017683

(51) Int. Cl.
*B44C 1/22* (2006.01)
*H01L 21/302* (2006.01)

(52) U.S. Cl. .............. 216/67; 216/58; 216/59; 438/706; 438/710; 219/121.54; 315/111.21

(58) Field of Classification Search .............. 216/58, 216/59, 67; 438/706, 710; 219/121.54
See application file for complete search history.

(56) References Cited

U.S. PATENT DOCUMENTS

| | | | |
|---|---|---|---|
| 4,863,549 A | 9/1989 | Grunwald | |
| 5,057,185 A | 10/1991 | Thomas et al. | |
| 5,087,857 A | 2/1992 | Ahn | |
| 5,314,603 A | 5/1994 | Sugiyama et al. | |
| 5,565,737 A | 10/1996 | Keane | |
| 5,698,062 A | 12/1997 | Sakamoto et al. | |
| 5,770,922 A | 6/1998 | Gerrish et al. | |
| 5,824,606 A | 10/1998 | Dible et al. | |
| 5,928,528 A | 7/1999 | Kubota et al. | |
| 5,935,373 A | 8/1999 | Koshimizu | |
| 6,046,641 A | 4/2000 | Chawla et al. | |
| 6,060,837 A | 5/2000 | Richardson et al. | |
| 6,214,162 B1 | 4/2001 | Koshimizu | |
| 6,411,490 B2 * | 6/2002 | Dible | 361/234 |
| 6,417,732 B1 | 7/2002 | Radomski et al. | |
| 6,472,822 B1 | 10/2002 | Chen et al. | |
| 6,673,724 B2 | 1/2004 | Forster et al. | |
| 6,849,154 B2 | 2/2005 | Nagahata et al. | |
| 6,917,204 B2 | 7/2005 | Mitrovic et al. | |
| 7,602,127 B2 | 10/2009 | Coumou | |
| 2003/0215373 A1 | 11/2003 | Reyzelman et al. | |

(Continued)

FOREIGN PATENT DOCUMENTS

DE 4122624 1/1993

(Continued)

OTHER PUBLICATIONS

Notice Requesting Submission of Opinion in corresponding Korean Patent Application No. 10-2006-0075704, mailed Feb. 29, 2008, with translation.

(Continued)

*Primary Examiner* — Shamim Ahmed

(74) *Attorney, Agent, or Firm* — Fish & Richardson P.C.

(57) ABSTRACT

Generating drive signals of at least two RF power generators which supply RF power to a plasma process, in which at least two drive signals, each driving one RF power generator, are generated in an RF generator driver. Each drive signal is generated by a respective function generator, such as a digital sine generator, of the generator driver.

14 Claims, 2 Drawing Sheets

U.S. PATENT DOCUMENTS

| | | | |
|---|---|---|---|
| 2006/0232471 A1 | 10/2006 | Coumou | |
| 2008/0105538 A1* | 5/2008 | Winterhalter et al. | 204/192.1 |
| 2009/0315463 A1* | 12/2009 | Coumou | 315/111.21 |

FOREIGN PATENT DOCUMENTS

| | | |
|---|---|---|
| DE | 4322608 | 1/1995 |
| DE | 10309711 | 9/2004 |
| EP | 1 134 773 | 9/2001 |
| EP | 1589793 | 10/2005 |
| JP | 5-205898 | 8/1993 |
| JP | 0673912 | 10/1994 |
| JP | 10326698 | 12/1998 |
| JP | 2001156006 | 6/2001 |
| JP | 2001-274099 | 10/2001 |
| JP | 2003257699 | 9/2003 |
| JP | 2003532986 | 11/2003 |
| JP | 2005123654 | 5/2005 |
| JP | 2005130198 | 5/2005 |
| JP | 2006216679 | 8/2006 |
| JP | 2006304585 | 11/2006 |
| KR | 1998-0012069 | 4/1998 |
| KR | 2000-0011902 | 2/2000 |
| KR | 2002-0077649 | 10/2002 |
| WO | WO 2004/064460 | 7/2004 |

OTHER PUBLICATIONS

English Translation of Office Action from corresponding Japanese Application No. 2006-218807, mailed Feb. 20, 2009, 7 pages.

Analog Devices, Preliminary Technical Data, AD9952, Direct Digital Synthesizer, 400 MSPS 14-Bit, 1.8V CMOS, Analog Devices, Inc., 2002.

Translation of Japanese Office Action for corresponding Japanese Application No. 2006-218807, mailed Jul. 29, 2009, 7 pages.

Office Action from German Application No. DE 10 2006 052 061.0-54, mailed Sep. 17, 2007, from the German Patent Office, with English translation, 11 pages.

English translation of Japanese Office Action from Japanese Patent Application No. 2007-287606, mailed Jul. 29, 2009, 38 pages.

Translation of the Notification of Reasons for Refusal and Rejection of Amendment for Japanese Application No. 2007-287606, dispatched Feb. 5, 2010, 10 pages.

* cited by examiner

SUPPLYING RF POWER TO A PLASMA PROCESS

RELATED APPLICATION

Under 35 U.S.C. §119, this application claims the benefit of a foreign priority application filed in Europe, serial number EP 05 017 683.3, filed Aug. 13, 2005, the entire contents of which are hereby incorporated by references.

TECHNICAL FIELD

The invention concerns a method of supplying RF power to a plasma process.

BACKGROUND

RF plasma processes are employed, for example, in etching, coating and ashing procedures. Such processes have been used up to now to process relatively small surfaces. The surfaces to be processed in plasma processes, however, become larger and larger, for example larger wafers in the semiconductor industry or larger flat panel displays. It has been relatively easy up to now to generate a homogeneous plasma over the surface to be processed, but the dimensions of the surfaces to be coated or etched today reach the wavelength range of the excitation signals of the plasma or the harmonics of the excitation signals. This produces wave structures in the plasma, which makes homogeneous plasma processing difficult.

To counteract this development, several RF plasma generators are conventionally used, which are operated at the same or different frequencies. U.S. Pat. No. 5,698,062 discloses an RF generator drive means that has a low-voltage source and a frequency divider. The frequency divider drives two RF amplifiers, which may also be considered as RF generators. These supply RF power to the plasma process at different locations. U.S. Pat. No. 5,824,606 discloses driving two RF generators with the same frequency and supplying RF power to the plasma process at different locations via these RF generators. The phase positions of the signals emitted by the RF generators are adjusted relative to each other using a phase shifter.

In FPD production experiments, it is currently tried to excite plasma with MF (10 kHz to 1 MHz) energy. Several electrode pairs are disposed in the direct vicinity of other electrode pairs. Each electrode pair is supplied by an MF generator. The MF generators are not operated synchronously and not necessarily at the same frequency, which can produce high voltages and beatings between two neighboring electrode pairs. These high voltages can produce highly undesired arcs between neighboring electrode pairs.

Improved apparatus and methods for driving RF power generators are needed, particularly methods that permit flexible adjustment and control of the power output of the RF power generators or the plasma process.

SUMMARY

According to one aspect of the invention, multiple drive signals are generated by respective function generators, preferably digital function generators such as sine generators, and are employed to drive respective RF generators to supply RF power to a plasma process. By using individually adjustable digital function generators for generating the drive signals, almost any drive signal can be generated. It is possible, in particular, to adjust the frequency and the phase position of each individual drive signal as well as the different relations between the different drive signals relative to each other, with the consequence that the RF power supply to the plasma process can be precisely adjusted and varied. The drive signals can thereby be suitably combined for different RF power generators, which, in turn, permits homogenization of the plasma even when large surfaces are coated or etched. Radio frequency in accordance with the present invention means a frequency in the range of between about 10 kHz and 300 MHz.

When the power distribution in the plasma chamber is detected or measured, the received values can be used to suitably select the drive signals for generating a homogeneous plasma. The power distribution in the plasma chamber can, in particular, be adjusted and controlled through corresponding drive signal manipulation. The use of a digital function generator gives the user a much wider range of adjustment compared to analog drive signal generation.

Additionally, the phase and/or frequency relation between the drive signals can be adjusted. Different scenarios are thereby feasible, depending on the application. The drive signals may be generated with the same frequency, for example, but be offset in phase. At least two drive signals may have different frequencies. The frequencies may thereby be arbitrarily selected or have a certain mutual mathematical relation. The frequencies may be selected as a multiple of a basic frequency.

The drive signals may be adjusted via at least one digital interface of the RF generator drive means. Several function generators may thereby be controlled by one single interface. It is clear that each function generator may have its own interface.

The drive signals may be advantageously set via a programmable logic component, such as an FPGA or other processor.

Depending on the performance of the plasma process, it may be necessary to change the phase positions between the drive signals. This may be effected e.g. by changing the phase position of one or several drive signals. The phase position of a drive signal is thereby preferably changed over a time period between 1 μs and 10 seconds, preferably between 1 ms and 2 seconds, and more preferably between 100 ms and 1 second. This means that the phase position of a drive signal changes from a first to a second phase position in a steady or continuous manner, or in other words gradually or with a ramp. This can prevent an abrupt phase change, in other words a phase jump, which could damage the RF generator or disturb the plasma process.

In order to ensure that a phase change is effected always with the same ramp irrespective of the initial and final phase positions, the speed at which the phase position changes may be adjusted or predetermined, in particular in percentages per unit time or in degrees per unit time.

The use of a digital function generator also allows at least one drive signal to be frequency- or phase-modulated. The frequency or phase modulation may thereby be effected via an external signal which is fed into an RF generator drive means or through corresponding programming, i.e. software, such that the digital function generator(s) is/are correspondingly driven to issue a frequency- or phase-modulated drive signal. The phase or frequency modulation may be used to optimize the process.

In some embodiments, the phase relation of at least two drive signals is changed, in particular abruptly, in case of a predetermined event, such as arc detection in the plasma process. With this measure, the power supply to the plasma process immediately changes, such that RF power supply to the arc is stopped which is thereby eliminated. It is clear that a change of the phase position of only one drive signal also changes the phase relation between two drive signals. For this reason, it may be sufficient to change the phase position of only one drive signal in order to change the phase relation of at least two drive signals.

In case of a predetermined event, such as the detection of an arc in the plasma process, at least one drive signal, preferably all drive signals, may alternatively or additionally be temporarily interrupted, which may also eliminate an arc. This arc elimination is thereby advantageously synchronized with the RF generators.

The method may be used with particular advantage for etching processes when the frequencies of the drive signals are selected as integer multiples of a fixed base frequency in the range between 1 and 6 MHz, in particular as an integer multiple of 3.39 MHz. Multiplication of the frequency of 3.39 MHz by a factor of 4 produces the particularly preferred ISM (industrial, scientific and medical) frequency of 13.56 MHz, and multiplication by a factor of 8 produces the ISM frequency of 27.12 MHz. The method may permit, for example, the generation of a drive signal at an ISM frequency and another drive signal at another multiple of the frequency 3.39 MHz. The clock frequency is preferably an integer multiple of the particularly preferred ISM frequency 13.56 MHz, which greatly facilitates adjustment of the particularly preferred ISM frequencies.

The digital frequency generators are preferably driven by a common clock frequency. This measure substantially facilitates adjustment of the frequencies and phase relations between two drive signals. Another possibility is to also supply a processor, which drives the function generators, with the common clock frequency to ensure synchronous transfer of data from the processor to the function generators.

The invention also comprises an RF generator drive means for driving at least two RF generators which feed RF power into a plasma process, wherein the drive means generates at least two drive signals, and the drive means comprises one signal generating configuration for each drive signal, which comprises an, in particular digital function generator, in particular sine generator. This configuration permits multifarious generation of drive signals. In particular, the phase position and frequency of each individual drive signal can be freely adjusted, which yields many possibilities of controlling the RF power generators and thereby the plasma process. AD9959 by Analog Devices is particularly preferred, which has four integrated digital function generators.

With particular preference, the function generator is designed as DDS (direct digital synthesizer). A DDS can generate, in particular, a stepped sine signal. The phase position can thereby be substantially freely adjusted. The frequency can also be adjusted within a wide range depending on the performance of the DDS. AD9952 by the company Analog Devices is particularly preferred for RF plasma applications.

The signal generating configurations preferentially comprise a filter means disposed downstream of the digital function generator. The output signal of the digital function generator may be stepped, in particular, have a stepped sine shape. This signal can be supplied to a filter means which smoothes the curve to produce an analog sine signal. This sine signal can drive certain RF generators.

In order to produce a drive signal for newer RF generators, the signal generating configurations advantageously comprise a comparator which generates the respective drive signal. A comparator can e.g. transform a smoothed sine signal into a rectangular signal for driving the RF generator. The function generator itself may thereby have a comparator, such that the digitized sine signal is initially put into a filter means where it is smoothed and the resulting signal is returned to the function generator and supplied to the comparator of the function generator.

With particular preference, a processor is provided for driving the signal generating configurations, which enables precise programming of the function generators of the signal generator configurations. The processor may be controlled and/or programmed via one or more interfaces.

Synchronization is realized by an oscillator for generating a clock signal, which is connected to the signal generating configurations and/or the processor.

In a particularly preferred embodiment of the invention, at least one interface, in particular, a digital interface and/or user interface (operating panel) may be provided, which provides access to the function generators, in particular via the processor. A user can thereby change the frequency or the phase e.g. within a predetermined range. Such interfaces also permit automatic regulation of the drive signals, in particular, of the frequencies and phase positions of the drive signals. At least two signal generator configurations may be controlled by one interface. Both signal generator configurations can thereby be controlled and their frequencies and phases can be adjusted in dependence on each other or independently of each other.

In addition to or as an alternative to the processor, the RF generator drive means may comprise a programmable digital logic component, in particular an FPGA, which is connected to the interface(s) and to the signal generator configurations, wherein the digital logic component may be designed as a processor.

The invention also comprises an RF plasma excitation configuration with at least two RF generators which are driven by an RF generator drive means as described above. The RF plasma excitation configurations may be those used, for example, in FPD production at frequencies of 3.39 MHz and multiples thereof. These RF plasma excitation configurations may also be coating systems of a range between 10 kHz to 1 MHz, wherein several electrode pairs are disposed in the direct vicinity, with the output signals of neighboring generators being synchronized and their phase positions being adjusted relative to one another.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference symbols in the various drawings indicate like elements.

DETAILED DESCRIPTION

Figure 1:
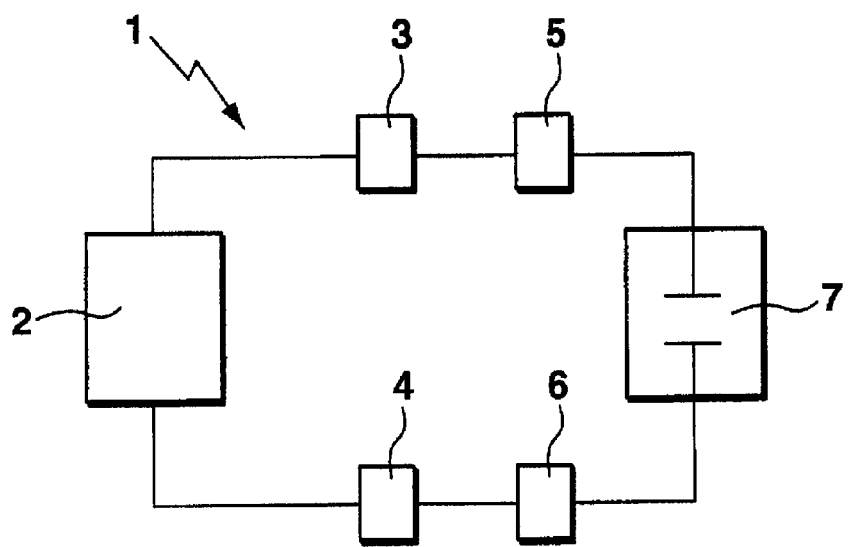
FIG. 1 shows a schematic view of an RF plasma excitation configuration.

FIG. 1 shows an RF plasma excitation configuration 1 which comprises an RF generator drive means 2, described in detail below, which generates two drive signals for a first and a second RF power generator 3, 4 in this embodiment. Each RF power generator 3, 4 is connected to a plasma chamber 7 via a matching network 5, 6. A plasma process is performed in the plasma chamber 7 by feeding in RF power via the two RF power generators 3, 4.

Figure 2:
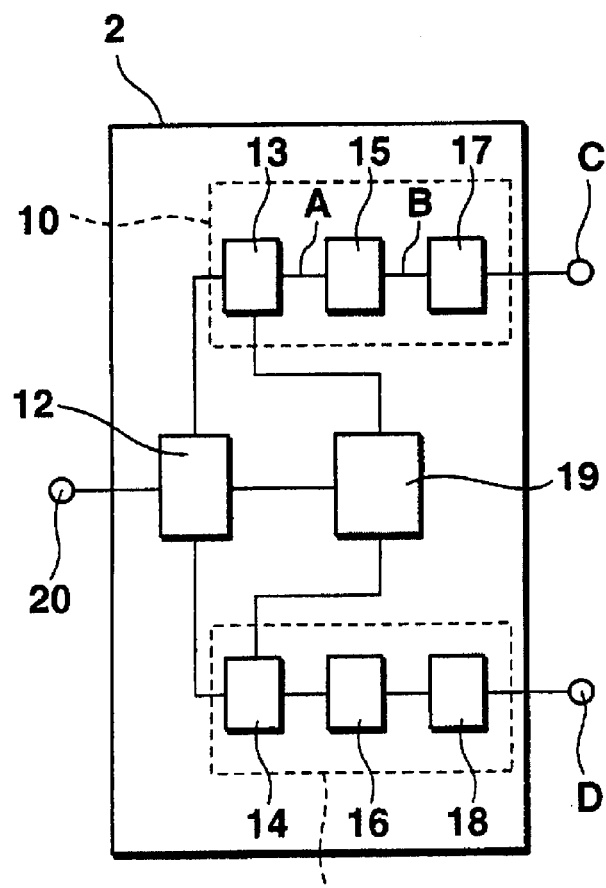
FIG. 2 shows an RF generator driver.
Figure 3:
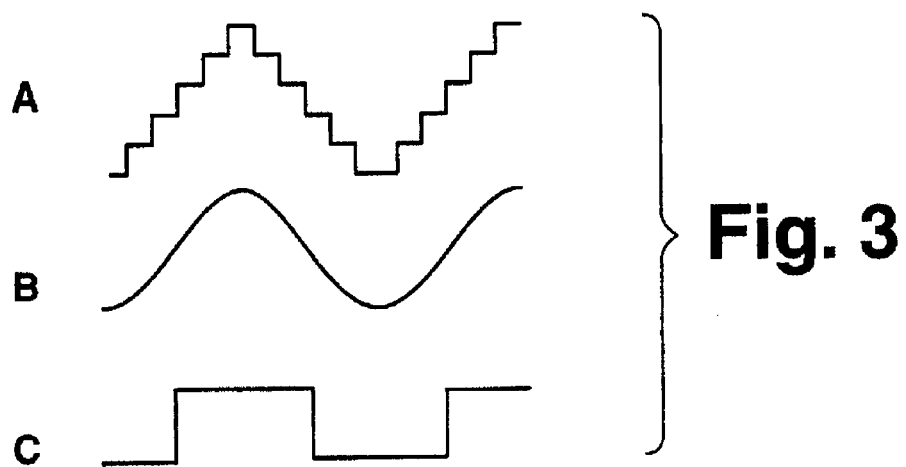
FIG. 3 shows a view of the signal behaviors at the points A, B, C of FIG. 2.

FIG. 2 shows the RF generator drive means 2. It comprises two signal generator configurations 10, 11 for generating the drive signals. A processor 12 predetermines the type of output signal to be generated by the signal generator configurations 10, 11. In particular, the frequency and phase of the drive signal are predetermined. A signal is generated in digital function generators 13, 14 on the basis of the given information, as shown, for example, by the signal A (FIG. 3, signal A corresponds to the signal at location A in FIG. 2). The signal A is stepped due to being digitally generated. This signal is supplied to a filter means 15 or 16 where it is smoothed to generate e.g. a sinusoidal signal B. This signal can be supplied to a comparator 17, 18 which changes it into a rectangular signal according to signal C.

The RF generator drive means 2 moreover comprises an oscillator 19 which presets a common clock. The oscillator 19 clocks, in particular, the digital function generators 13, 14, which are designed as so-called DDS in this embodiment, and the processor 12. Interfaces 20 may be provided, only one of which is shown in FIG. 2, to control the generation of the drive signals. A user may e.g. thereby adjust or change the phase position and/or the frequency of the drive signals. A signal, input via the interface 20, of a range between 0 and 5 V can thereby be mapped on a phase of a range between 0 and 360° in the processor 12. It is however, also feasible to map a predetermined voltage range on a frequency of a range between 10 kHz to 300 MHz or on a range of multipliers by which a basic frequency, such as of 3.39 MHz, is multiplied. A predetermined voltage range may alternatively be mapped on integer divisors which divide a predetermined basic frequency of 27.12 MHz, for example.

Figure 4A:
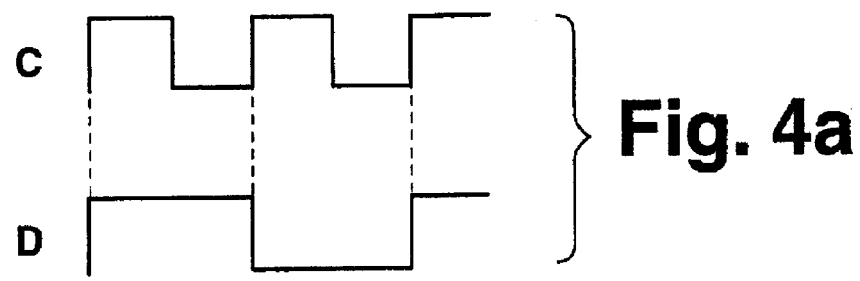
FIGS. 4a to 4c show by means of example several possible combinations of drive signals.
Figure 4B:
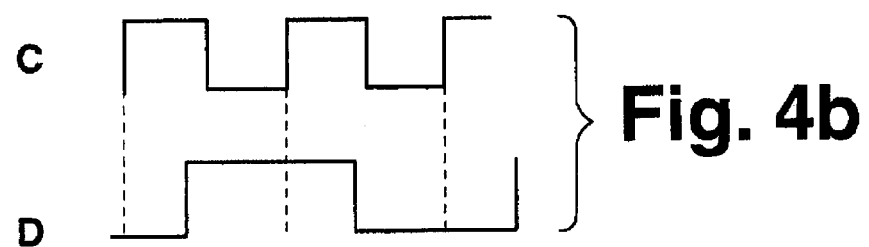
Figure 4C:
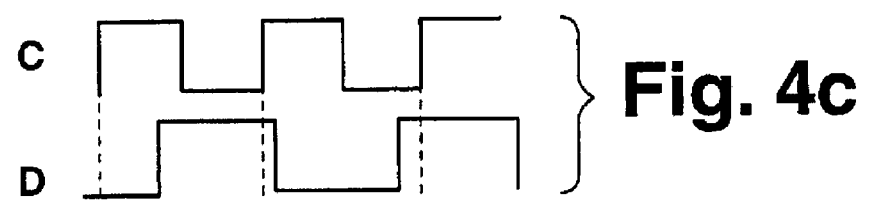

FIGS. 4a to 4c show different drive signal C, D behaviors. The signals C, D of FIG. 4a are synchronized, wherein the drive signal C has twice the frequency of the drive signal D.

The signals C, D of FIG. 4b have the same frequency relation, such that signal C has twice the frequency of signal D, but signal D is phase-shifted relative to signal C.

The signals C, D in FIG. 4c have different frequencies and no defined phase relation. In particular, the frequency of signal D differs from that of signal C. None of the signals C, D is an integer multiple of the respective other signal C, D.

The invention was explained on the basis of two RF power generators and two drive signals C, D. It is clear that RF generator drive means 2 can be provided with more than two signal generating configurations 10, 11 to generate a correspondingly larger number of drive signals C, D whose mutual frequency and phase relations may vary.

A number of embodiments of the invention have been described. Nevertheless, it will be understood that various modifications may be made without departing from the spirit and scope of the invention. Accordingly, other embodiments are within the scope of the following claims.

What is claimed is:

1. A method of supplying radio frequency (RF) power to a plasma process, the method comprising
providing multiple RF power generators configured to supply RF power to a plasma process;
directly connecting a single RF generator driver to each of the RF power generators, the RF generator driver comprising multiple function generators, wherein each function generator is connected to one RF power generator;
generating a respective drive signal for a respective RF power generator with each function generator; and
driving the RF power generators with the respective drive signals, each of the drive signals driving a respective power generator, wherein the drive signals are selected to generate a homogeneous plasma, to adjust the power distribution in the plasma chamber, or both.

2. The method of claim 1, wherein the function generators generate the drive signals digitally.

3. The method of claim 1, further comprising adjusting a phase relation, a frequency relation, or both a phase relation and a frequency relation, of the drive signals.

4. The method of claim 1, wherein at least two of the drive signals have different frequencies.

5. The method of claim 1, further comprising adjusting the drive signals via an input interface of the RF generator driver.

6. The method of claim 1, further comprising adjusting the drive signals via a programmable logic component.

7. The method of claim 1, further comprising changing a phase position of a drive signal over a time period of between about one microsecond and 10 seconds.

8. The method of claim 7, wherein the time period is between about 100 milliseconds and one second.

9. The method of claim 1, further comprising adjusting a speed of a phase position change of at least one of the drive signals.

10. The method of claim 1, wherein at least one of the drive signals is frequency- or phase-modulated.

11. The method of claim 1, further comprising changing a phase relation of the drive signals in response to a predetermined event.

12. The method of claim 1, wherein the drive signals are generated to have frequencies that are integer multiples of a base frequency of between about 1 and 6 MHz.

13. The method of claim 1, further comprising driving the frequency generators by a common clock frequency.

14. The method of claim 1, further comprising altering the drive signals through respective comparators.

* * * * *